(12) United States Patent
Liu (10) Patent No.: US 11,728,811 B2
(45) Date of Patent: Aug. 15, 2023

(54) KEY REUSE CIRCUIT AND POS TERMINAL

(71) Applicant: PAX COMPUTER TECHNOLOGY (SHENZHEN) CO., LTD., Guangdong (CN)

(72) Inventor: Yuping Liu, Guangdong (CN)

(73) Assignee: PAX COMPUTER TECHNOLOGY (SHENZHEN) CO., LTD., Guangdong (CN)

( * ) Notice: Subject to any disclaimer, the term of this patent is extended or adjusted under 35 U.S.C. 154(b) by 0 days.

(21) Appl. No.: 17/796,301

(22) PCT Filed: Mar. 4, 2021

(86) PCT No.: PCT/CN2021/079080
§ 371 (c)(1),
(2) Date: Jul. 29, 2022

(87) PCT Pub. No.: WO2021/175286
PCT Pub. Date: Sep. 10, 2021

(65) Prior Publication Data
US 2023/0091370 A1    Mar. 23, 2023

(30) Foreign Application Priority Data

Mar. 4, 2020 (CN) .......................... 202010141485.1

(51) Int. Cl.
*H03K 19/0175* (2006.01)
(52) U.S. Cl.
CPC .............................. *H03K 19/017509* (2013.01)
(58) Field of Classification Search
CPC .............................. H02M 3/00; H02M 1/4291
See application file for complete search history.

(56) References Cited

U.S. PATENT DOCUMENTS

| | | | |
|---|---|---|---|
| 6,625,739 B1 * | 9/2003 | Kobayashi | G06F 1/24 713/310 |
| 2005/0068303 A1 | 3/2005 | Ho et al. | |
| 2011/0158407 A1 * | 6/2011 | Paksoy | G06F 21/78 380/249 |

FOREIGN PATENT DOCUMENTS

| | | | |
|---|---|---|---|
| CN | 204103881 U | * | 1/2015 |
| CN | 204103881 U | | 1/2015 |

(Continued)

*Primary Examiner* — John W Poos
*Assistant Examiner* — Tyler J Pereny
(74) *Attorney, Agent, or Firm* — Brooks Kushman PC; John E. Nemazi (57) ABSTRACT

A key reuse circuit is provided, a key component is used to generate a DC voltage and a startup-trigger-signal according to a user input, the switch circuit generates a key trigger signal according to the DC voltage, the control circuit reverses a level of an enable-regulation-signal when a time duration of the key trigger signal is longer than or equal to a preset time duration, or determines a key value of the key component when the time duration of the key trigger signal is shorter than the preset time duration, the power on/off regulation circuit generates a voltage-conversion-enable-signal according to the startup-trigger-signal and an enable-regulation-signal having a first level, the buck circuit generates a first voltage according to the power voltage and the voltage-conversion-enable-signal and stops generating the first voltage when the voltage-conversion-enable-signal is terminated, so that reuse of a general key in the key matrix is realized.

12 Claims, 3 Drawing Sheets

(56) References Cited

FOREIGN PATENT DOCUMENTS

| CN | 107066021 A | 8/2017 |
| CN | 208477519 U | 2/2019 |
| CN | 110850161 A | 2/2020 |

* cited by examiner

KEY REUSE CIRCUIT AND POS TERMINAL

CROSS-REFERENCE TO RELATED APPLICATIONS

This application is a national phase of PCT patent application Serial No. PCT/CN2021/079080, filed on Mar. 4, 2021, which claims priority to Chinese patent application No. 202010141485.1 filed on Mar. 4, 2020 and entitled "key reuse circuit and POS terminal", the entire contents of which are incorporated herein by reference.

BACKGROUND

Technical Field

The present application relates to the technical field of reuse of keys, and more particularly to a key reuse circuit and a POS terminal having the key reuse circuit.

Description of Related Art

A key switch mainly refers to a light touch key switch, and is also called a light touch switch because this key switch has the advantages including small contact resistance, accurate operation force error, diversified specification, so that the key switch may be widely used in aspects such as electronic equipment and white household appliances. Various commands and characters are input through the key switch to make effective control of a device (e.g., power on/off of an electronic device). One device may be provided with multiple key switches, however, for a device with smaller size, only a limited number of key switches may be arranged on a panel of this device due to limited spatial position of this device; in this condition, in order to realize all functions of device-related key switches, the key switches need to be reused, that is, multiple functions are realized through one single key switch. Currently, the conventional key reuse method is generally implemented through a timing control of a controller; as an alternative, reuse of a key is realized according to a reuse pin of the controller, more control chips need to be added or the currently available pins of the controller need to be occupied, so that the cost is high, power on/off and the reuse of the key cannot be realized on the basis of the currently available key matrix, and it is inconvenient to make an optimization design on an appearance design and a volume of a POS terminal.

As described above, there are problems that the key reuse circuit has a complex circuit configuration and has a high cost, and cannot realize power on/off and reuse of one key on the basis of the currently available key matrix, and it is inconvenient to make the optimization design on the appearance design and the volume of the electronic device (e.g., the POS terminal) in the existing key reuse method.

SUMMARY

One objective of the present application is to provide a key reuse circuit and a POS terminal, which aim at solving the problems existing in the conventional POS terminal that the key reuse circuit of the conventional POS terminal has a complex circuit configuration and has a high cost, and cannot realize power on/off and reuse of one key on the basis of the currently available key matrix, and it is inconvenient to make the optimization design on the appearance design and the volume of the electronic device (e.g., POS terminal).

A key reuse circuit is provided in the first aspect of the embodiments of the present application, the key reuse circuit includes:

a key component configured to be communicated with a power voltage to generate a DC voltage and a startup-trigger-signal according to a user input; wherein the key component is one key in a key matrix;

a switch circuit, connected with the key component and configured to generate a key trigger signal according to the DC voltage;

a control circuit, connected with the switch circuit and the key component, and configured to reverse a level of an enable-regulation-signal according to the key trigger signal when a time duration of the key trigger signal is longer than or equal to a preset time duration, and to obtain a key value of the key component according to the key trigger signal and implement functions of the key component corresponding to the key value when the time duration of the key trigger signal is shorter than the preset time duration;

a power on/off regulation circuit, connected with the switch circuit and the control circuit, and configured to generate a voltage-conversion-enable-signal according to the startup-trigger-signal and the enable-regulation-signal having a first level, and stop generating the voltage-conversion-enable-signal when a generation of the enable-regulation-signal having a second level is terminated;

a buck circuit, connected with the power on/off regulation circuit, and configured to generate a first voltage according to the power voltage and the voltage-conversion-enable-signal, and stop generating the first voltage when a generation of the voltage-conversion-enable-signal is terminated;

a DC/DC converter circuit, connected with the buck circuit, the switch circuit and the power on/off regulation circuit, and configured to convert the first voltage into an operating voltage to supply power for a plurality of functional circuits of the key reuse circuit, and stop generating the operating voltage when a generation of the first voltage is terminated.

In one preferable embodiment, the key reuse circuit further includes:

a power adapter circuit connected with the buck circuit and configured to generate the power voltage according to a power input from an external power source.

In one embodiment, the switch circuit includes a first resistance, a second resistance, a third resistance, a fourth resistance, a first capacitance, and a first triode;

where a first end of the first resistance and a first end of the first capacitance are collectively constituted as a DC voltage input of the switch circuit, a second end of the first resistance is connected with a first end of the third resistance and a first end of the second resistance, a second end of the third resistance is connected with a base electrode of the first triode, a second end of the second resistance and a second end of the first capacitance are connected with a power ground, and a collector electrode of the first triode is connected with a first end of the fourth resistance;

a second end of the fourth resistance is a first operating voltage input of the switch circuit;

the collector electrode and the emitting electrode of the first triode are constituted as a key trigger signal output of the switch circuit.

In one preferable embodiment, the power on/off regulation circuit includes: a fifth resistance, a sixth resistance, a seventh resistance, an eighth resistance, a second capacitance, a third capacitance, a first diode, and a second diode;

where a first end of the fifth resistance is a first operating voltage input of the power on/off regulation circuit, a second end of the fifth resistance is connected with a first end of the sixth resistance, a second end of the sixth resistance and a first end of the second capacitance are connected with an anode of the second diode, a cathode of the second diode is connected with a first end of the seventh resistance, a second end of the second capacitance is connected with a power ground, a second end of the seventh resistance is connected with a cathode of the first diode, an anode of the first diode is connected with a first end of the third capacitance and a first end of the eighth resistance, and a second end of the third capacitance is connected with the power ground;

a second end of the fifth resistance and a first end of the sixth resistance are constituted as an enable-regulation-signal input of the power on/off regulation circuit;

a second end of the seventh resistance and a cathode of the first diode are constituted as a voltage-conversion-enable-signal output of the power on/off regulation circuit;

a second end of the eighth resistance is a startup-trigger-signal input of the power on/off regulation circuit.

In one preferable embodiment, the buck circuit includes a buck circuit chip, a fourth capacitance, a fifth capacitance, a sixth capacitance, a ninth resistance, a tenth resistance, an eleventh resistance, a twelfth resistance, a thirteenth resistance, a third diode, and a first inductance;

where a first end of the tenth resistance is a power voltage input of the buck circuit, a second end of the tenth resistance and a first end of the fourth capacitance are connected with an input of the buck circuit chip, a second end of the fourth capacitance and a ground terminal of the buck circuit chip are connected with a power ground, a self-boosting end of the buck circuit chip is connected with a first end of the fifth capacitance, a sensing end of the buck circuit chip and a second end of the fifth capacitance are connected with a first end of the first inductance, a second end of the first inductance and a first end of the eleventh resistance are connected with a first end of the twelfth resistance and the first end of the sixth capacitance, a second end of the eleventh resistance, a second end of the twelfth resistance, a second end of the sixth capacitance, and a feedback end of the buck circuit chip are connected with a first end of the thirteenth resistance, a second end of the thirteenth resistance is connected with the power ground, an enable pin of the buck circuit chip and a first end of the ninth resistance are connected with a cathode of the third diode, and a second end of the ninth resistance and an anode of the third diode are connected with the power ground;

the enable pin of the buck circuit chip is the voltage-conversion-enable-signal input of the buck circuit;

the second end of the first inductance is a first voltage output of the buck circuit.

In one preferable embodiment, the control circuit includes a microprocessor and a seventh capacitance;

where a power terminal of the microprocessor is connected with a first end of the seventh capacitance, a second end of the seventh capacitance is connected with a power ground, and a ground terminal of the microprocessor is connected with the power terminal;

a first data input/output of the microprocessor and a second data input/output of the microprocessor are constituted as a key trigger signal input of the control circuit;

a third data input/output of the microprocessor is the enable-regulation-signal output of the control circuit;

the power terminal of the microprocessor is a first operating voltage input of the control circuit.

A POS terminal is provided in the second aspect of the embodiments of the present application, where the POS terminal includes the aforesaid key reuse circuit in the first aspect of the embodiments of the present application.

According to the key reuse circuit and the POS terminal according to the embodiments of the present application, one key in the key matrix is used to be connected to the power voltage so as to generate the key trigger signal according to the user input, the switch circuit generates the key trigger signal according to the DC voltage, the control circuit reverses the level of the enable-regulation-signal when the time duration of the key trigger signal is longer than the preset time duration or generates the key value of the key component when the time duration of the key trigger signal is shorter than the preset time duration, the power on/off regulation circuit generates the voltage-conversion-enable-signal according to the startup-trigger-signal and the enable-regulation-signal having the first level, and stops generating the voltage-conversion-enable-signal according to the enable-regulation-signal having the second level; the buck circuit generates the first voltage according to the power voltage and the voltage-conversion-enable-signal and stops generating the first voltage when the voltage-conversion-enable-signal is terminated. The DC/DC converter circuit converts the first voltage into the operating voltage and supplies power for the various functional circuits and stops generating the operating voltage when the first voltage is terminated; thus, the reuse of one key in the universal digital or functional key matrix is realized, one key can be used as a power key and can also be used as a universal key, the key reuse circuit is prone to be implemented, the circuit configuration of the key reuse circuit is simple, and the cost is low, there is no need to arrange a power key separately, so that the number of the keys and space occupation of the keys are reduced, appearance design of the POS terminal is facilitated, a more compact design of POS terminal can be realized; it is convenient to make an overall design of the POS terminal, the POS terminal may support different power inputs and is high in practicability.

DETAILED DESCRIPTION OF EMBODIMENTS

In order to make the purpose, the technical solution and the benefits of the present application be clearer and more understandable, the present application will be further described in detail below with reference to accompanying figures and embodiments. It should be understood that the embodiments described in detail herein are merely intended to illustrate but not to limit the present application.

It needs to be noted that, when one component is described to be "fixed to" or "arranged on" another component, this component may be directly or indirectly arranged on another component. When it is described that one component "is connected with" another component, this component may be directly or indirectly connected to the another component.

In addition, terms "the first" and "the second" are only used for description purposes, and should not be considered as indicating or implying any relative importance, or implicitly indicating the number of indicated technical features. As such, technical feature(s) restricted by "the first" or "the second" can explicitly or implicitly includes one or more such technical feature(s). In the description of the present application, "a plurality of" means two or more, unless there is additional explicit and specific limitation.

Figure 1:
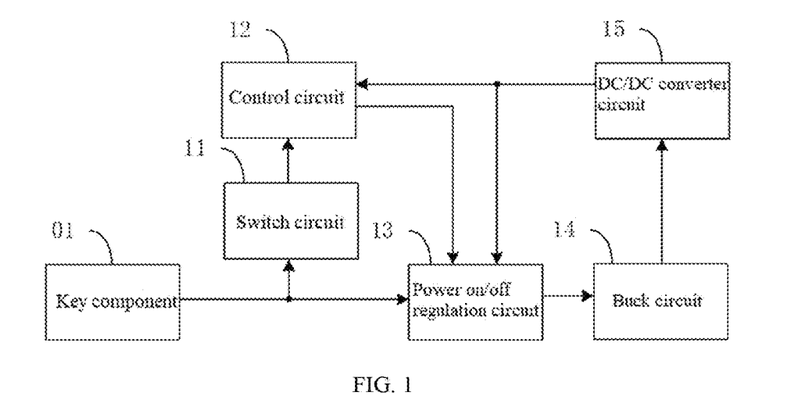
FIG. 1 illustrates one schematic structure of a key reuse circuit according to one embodiment of the present application.

FIG. 1 is a schematic circuit configuration of a key reuse circuit according to one embodiment of the present application (FIG. 1 illustrates a first embodiment of the present application), and for the convenience of description, the part related to this embodiment is shown merely, and this part is described in detail below:

a key reuse circuit, including: a key component 01, a switch circuit 11, a control circuit 12, a power on/off regulation circuit 13, a buck circuit 14, and a DC (Direct Current)/DC (Direct Current) converter circuit 15.

The key component 01 is configured to be communicated with a power voltage and generate a DC (Direct Current) voltage and a startup-trigger-signal according to the user input; the key component 01 is one key in a key matrix 100; the switch circuit 11 is connected with the key component 01 and is configured to generate a key trigger signal according to the DC voltage; the control circuit 12 is connected with the switch circuit 11 and the key component 01, and is configured to reverse a level of an enable-regulation-signal according to the key trigger signal when a time duration of the key trigger signal is longer than or equal to the preset time duration, or obtain a key value of a functional key according to the key trigger signal when the time duration of the key trigger signal is shorter than the preset time duration; the power on/off regulation circuit 13 is connected with the switch circuit 11 and the control circuit 12, and is configured to generate a voltage-conversion-enable-signal according to the startup-trigger-signal and an enable-regulation-signal having a first level, and stop generating the voltage-conversion-enable-signal when the enable-regulation-signal having a second level is terminated; the buck circuit 14 is connected with the power on/off regulation circuit 13 and is configured to generate a first voltage according to the power voltage and the voltage-conversion-enable-signal, and stop generating the first voltage when the voltage-conversion-enable-signal is terminated; the DC/DC converter circuit 15 is connected with the buck circuit 14, the switch circuit 11 and the power on/off regulation circuit 13 and is configured to convert the first voltage to generate an operating voltage to supply power for a plurality of functional circuits of the key reuse circuit, and stop generating the operating voltage when the first voltage is terminated.

In one preferable embodiment, the key matrix 100 is a universal key array, and one key in the universal key array is used as the key component 01. As an alternative, the first level is a high level, and the second level is a low level. When a device is powered on and started up, the switch circuit 11 is communicated with the power voltage and generates the DC voltage and the startup-trigger-signal at the time when it is pressed, the power-up-and-power-off-regulation circuit 13 generates valid voltage-conversion-enable-signal (e.g., voltage-conversion-enable-signal having high level) according to the startup-trigger-signal, the buck circuit 14 generates the first voltage to supply power to the control circuit 12 according to the power voltage and the voltage-conversion-enable-signal having the high level; the DC/DC converter circuit 15 converts the first voltage into the operating voltage to supply power to other functional circuit such as the control circuit 12, the operating voltage includes a first operating voltage; after the control circuit 12 is powered on, the control circuit 12 generates an enable-regulation-signal having high level according to the key trigger signal, so that the voltage-conversion-enable-signal is kept at high level, and the buck circuit 14 and the DC/DC converter circuit 15 can provide power supply to the control circuit 12 and other functional circuits stably and continuously, thereby realizing the function of power-on and startup.

In a normal operation process of the control circuit 12, the switch circuit 11 generates the key trigger signal again after the key component 01 is pressed again, the control circuit 12 receives the key trigger signal and confirm the time duration of the key trigger signal, that is, confirm the time duration during which the key component 01 has been pressed; when the time duration of the key trigger signal is longer than or equal to the preset time duration (for example, the preset time duration is 2 s), the control circuit 12 obtains key value information of a power key and reverses the level of the enable-regulation-signal according to the key trigger signal, that is, the control circuit 12 reverses the enable-regulation-signal having high level into the enable-regulation-signal with low level; the power on/off regulation circuit 13 stops generating a valid voltage-conversion-enable-signal according to the enable-regulation-signal having the low level; the buck circuit 14 stops generating the first voltage when the voltage-conversion-enable-signal is terminated, and the DC/DC converter circuit 15 stops generating the operating voltage when the first voltage is terminated, so that the control circuit 12 and other functional circuits are switched off and stop operation, and a power off function is realized; when the time duration of the key trigger signal is shorter than the preset time duration (i.e., 2 seconds), the control circuit 12 obtains a key value of the key component 01 according to the key trigger signal, and performs a corresponding universal key function according to the key value of the key component 01; in this condition, the voltage conversion circuit 14 and the DC/DC converter circuit 15 are operated normally, and supply power to the control circuit 12 and other functional circuits of an electronic device (e.g., a POS terminal) continuously and stably.

According to this embodiment of the present application, the reuse of one key in an universal digital or functional key matrix may be realized, so that this key may not only be used as the power key but also be used as a universal key, the key reuse circuit may be prone to be realized and the circuit configuration of the key reuse circuit is simple, the cost of the key reuse circuit is low, there is no need to arrange a power key separately, the number of keys and the space occupation of the keys are reduced, the design appearance of the POS terminal may be facilitated, and thus the POS terminal may be designed as being smaller in size; it is convenient to make an overall structural design of the POS terminal, the POS terminal may support different power inputs and is high in practicability.

Figure 2:
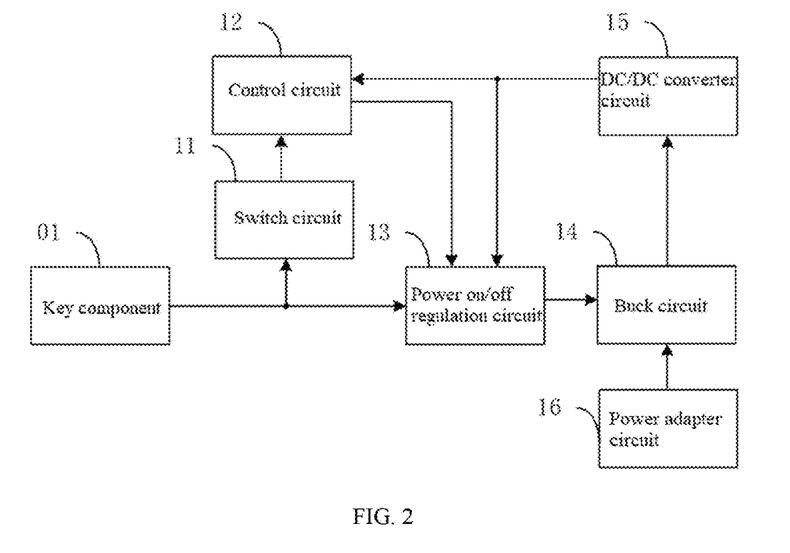
FIG. 2 illustrates another schematic structure of the key reuse circuit according to one embodiment of the present application.

Referring to FIG. 2, in one preferable embodiment, the key reuse circuit further includes a power adapter circuit 16.

The power adapter circuit 16 is connected with the buck circuit 14 and is configured to generate a power voltage according to a power input from an external power source.

In one preferable embodiment, the power adapter circuit 16 may convert an external input AC (Alternating Current) power (e.g., mains voltage) into a power voltage through voltage conversion and voltage stabilization, thereby realizing supplying power voltage to the key reuse circuit reliably.

Figure 3:
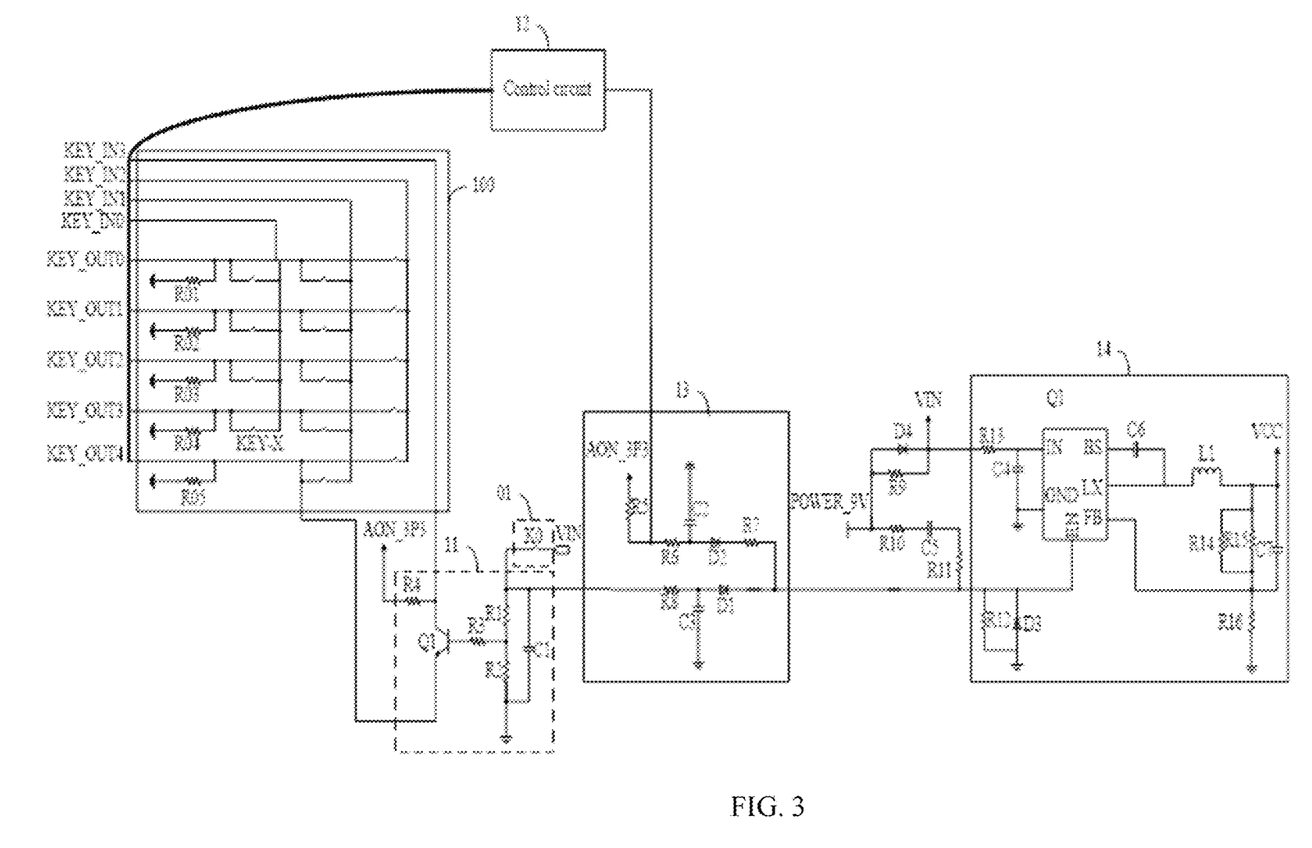
FIG. 3 illustrates a schematic circuit configuration of the key reuse circuit shown in FIG. 1.

Referring to FIG. 3, the switch circuit 11 includes a first resistance R1, a second resistance R2, a third resistance R3, a fourth resistance R4, a first capacitance C1 and a first triode Q1.

Where a first end of the first resistance R1 and a first end of the first capacitance C1 are constituted as a DC voltage input of the switch circuit 11, a second end of the first resistance R1 is connected with a first end of the third resistance R3 and a first end of the second resistance R2, a second end of the third resistance R3 is connected with a base electrode of the first triode Q1, a second end of the second resistance R2 and a second end of the first capacitance C1 are connected with a power ground, and a collector electrode of the first triode Q1 is connected with a first end of the fourth resistance R4.

A second end of the fourth resistance R4 is a first operating voltage input of the switch circuit 11.

The collector electrode of the first triode Q1 and the emitting electrode of the first triode Q1 are constituted as a key trigger signal output of the switch circuit 11.

Referring to FIG. 3, in one preferable embodiment, the power on/off regulation circuit 13 includes a fifth resistance R5, a sixth resistance R6, a seventh resistance R7, an eighth resistance R8, a second capacitance C2, a third capacitance C3, a first diode D1 and a second diode D2.

Where a first end of the fifth resistance R5 is the first operating voltage input of the power on-off regulation circuit 13, a second end of the fifth resistance R5 is connected with a first end of the sixth resistance R6, a second end of the sixth resistance R6 and a first end of the second capacitance C2 are connected with an anode of the second diode D2, a cathode of the second diode D2 is connected with a first end of the seventh resistance R7, a second end of the second capacitance C2 is connected with the power ground, a second end of the seventh resistance R7 is connected with a cathode of the first diode D1, an anode of the first diode D1 and a first end of the third capacitance C3 are connected with a first end of the eighth resistance R8, and a second end of the third capacitance C3 is connected with the power ground.

A second end of the fifth resistance R5 and a first end of the sixth resistance R6 are constituted as an enable-regulation-signal input of the power on-off regulation circuit 13 together.

A second end of the seventh resistance R7 and the cathode of the first diode D1 are constituted as a voltage-conversion-enable-signal output of the power on-off regulation circuit 13.

A second end of the eighth resistance R8 is a startup-trigger-signal input of the power on-off regulation circuit 13.

Referring to FIG. 3, in one preferable embodiment, the buck circuit 14 includes a buck circuit chip U1, a fourth capacitance C4, a fifth capacitance C6, a sixth capacitance C7, a ninth resistance R12, a tenth resistance R13, an eleventh resistance R14, a twelfth resistance R15, a thirteenth resistance R16, a third diode D3, and a first inductance L1.

Where a first end of the tenth resistance R13 is a power voltage input of the buck circuit 14, a second end of the tenth resistance R13 and a first end of the fourth capacitance C4 are connected with an input IN of the buck circuit chip U1, a second end of the fourth capacitance C4 and a ground terminal GND of the buck circuit chip U1 are connected with the power ground, a self-boosting terminal BS of the buck circuit chip U1 is connected with a first end of the fifth capacitance C6, a sensing terminal LX of the buck circuit chip U1 and a second end of the fifth capacitance C6 are connected with a first end of the first inductance L1, and a second end of the first inductance L1 is connected with a first end of the eleventh resistance R14, a first end of the twelfth resistance R15 and a first end of the sixth capacitance C7, a second end of the eleventh resistance R14, a second end of the twelfth resistance R15 and a feedback pin FB of the buck circuit chip U1 are connected with a first end of the thirteenth resistance R16, a second end of the thirteenth resistance R16 is connected with the power ground, an enable pin EN of the buck circuit chip U1 and a cathode of the ninth resistance R12 are connected with a cathode of the third diode D3, and a second end of the ninth resistance R12 and an anode of the third diode D3 are connected with the power ground.

The enable pin EN of the buck circuit chip U1 is a voltage-conversion-enable-signal input of the buck circuit 14.

The second end of the first inductance L1 is a first voltage output of the buck circuit 14.

Figure 4:
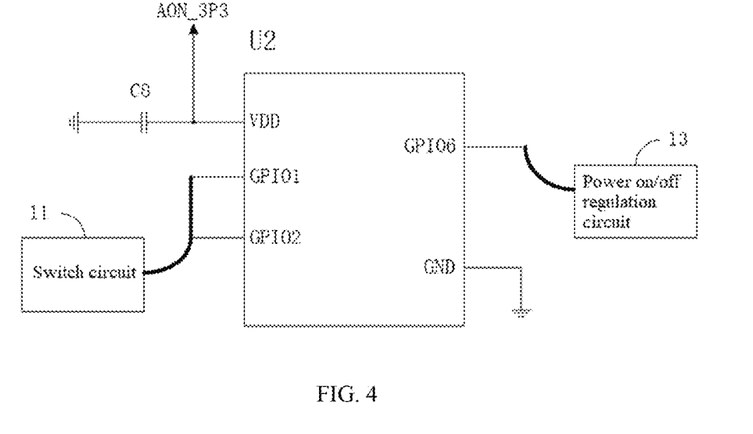
FIG. 4 illustrates a schematic circuit configuration of a control circuit in the key reuse circuit shown in FIG. 1.

Referring to FIG. 4, in one preferable embodiment, the control circuit 12 includes a microprocessor U2 and a seventh capacitance C8; where the power terminal VDD of the microprocessor U2 is connected with a first end of the seventh capacitance C8, a second end of the seventh capacitance C8 is connected with the power ground, and a ground terminal GND of the microprocessor U2 is connected with the power terminal; a first data input/output GPIO1 of the microprocessor U2 and a second data input/output GPIO2 of the microprocessor U 2 are constituted as a key trigger signal input of the control circuit 12 together; a third data input/output GPIO6 of the microprocessor U2 is an enable-regulation-signal output of the control circuit 12; and the power terminal VDD of the microprocessor U2 is a first operating voltage input of the control circuit 12.

In one preferable embodiment, an optional power voltage is represented as VIN, the DC voltage is equal to the power voltage, the first voltage is represented as VCC, the first operating voltage is represented as AON_3P3, the voltage value of the first voltage may be equal to or different from the voltage value of the first operating voltage. The key component 01 is represented as key K0, a first end of the key K0 is connected with the power voltage, and a second end of the key K0 is connected with a first end of the first resistance R1 of the switch circuit 11.

The working principle of the key reuse circuit will be briefly described below with reference to FIG. 3 and FIG. 4.

When the key K0 is pressed, the key K0 is connected with the power voltage VIN and generates DC voltage and a startup-trigger-signal, the switch circuit 11 generates a key trigger signal according to the DC voltage and outputs the key trigger signal to the microprocessor U2, the startup-trigger-signal is output to the first end of the eighth resistance R8 of the power on/off regulation circuit 13. After the startup-trigger-signal is communicated through the eighth resistance R8 and the first diode D1, a voltage-conversion-enable-signal having high level is generated and is output to the enable pin EN of the buck circuit chip U1. The buck circuit chip U1 generates a first voltage VCC according to the voltage-conversion-enable-signal and the power voltage VIN, the DC/DC converter circuit 15 performs voltage conversion on the first voltage VCC to generate a first operating voltage AON_3P3, and supplies power to the microprocessor U2 and other functional circuits through the first voltage VCC and the first operating voltage AON_3P3. After the microprocessor U2 is powered on, an enable-regulation-signal having high level is generated according to the key trigger signal, so that the voltage-conversion-enablesignal is kept at a high level, and the buck circuit chip U1 and the DC/DC converter circuit 15 may provide power supply to the microprocessor U2 and other functional circuits of the key reuse circuit continuously and stably, thereby realizing power-on and startup functions.

In a normal operation process of the microprocessor U2, when the key K0 is pressed again, the microprocessor U2 outputs another key trigger signal, the microprocessor U2 receives the key trigger signal and determines a time duration of the key trigger signal; when the time duration of the key trigger signal is longer than or equal to a preset time duration (e.g., 2 seconds), the microprocessor U2 reverses the level of the enable-regulation-signal according to the key trigger signal in order to reverse the enable-regulation-signal having high level into the enable-regulation-signal with low level, the enable-regulation-signal having low level is communicated through the fifth resistor R5, the sixth resistor R6, and the second diode D2, so that a generation of a valid voltage-conversion-enable-signal is terminated, the buck circuit chip U1 stops generating the first voltage VCC due to termination of valid voltage-conversion-enable-signal, the DC/DC converter circuit 15 stops generating the first operating voltage AON_3P3 due to the termination of the generation of the first voltage VCC; thus, the microprocessor U2 and other functional circuits are powered off and are out of operation, and a power-off function of the key K0 is realized. When the time duration of the key trigger signal is shorter than the preset time duration (e.g., 2 seconds), the microprocessor U2 obtains a key value of the key K0 according to the key trigger signal, and implements the functions corresponding to the key value of the key K0. In this condition, the buck circuit chip U1 and the DC/DC converter circuit 15 are operated normally, and keep supplying power to the microprocessor U2 and other functional circuits stably, so that a general key function of the key K0 is realized.

A POS terminal is provided in a second aspect of the embodiments of the present application, where the POS terminal includes the aforesaid key reuse circuit.

According to the embodiment of the present application, the reuse of one key in the universal digital or functional key matrix may be realized, so that this key can not only be used as a power key but also be used as a universal key, the key reuse circuit is prone to be implemented, the circuit configuration of the key reuse circuit is simple, and the cost is low, there is no need to arrange a power key separately, so that the number of the keys and space occupation of the keys are reduced, appearance design of the POS terminal is facilitated, a more compact design of the POS terminal can be realized; it is convenient to make an overall design of the POS terminal, the POS terminal may support different power inputs and is high in practicability.

It may be clearly understood by a person of ordinary skill in the art that, in order to describe the present application conveniently and concisely, dividing of the aforesaid various functional circuits, functional units and functional modules are described as examples, in actual application, the aforesaid functions may be assigned to different functional circuits, functional units and functional modules to be accomplished, that is, the inner structure of the device is divided into functional circuits, functional units or modules so as to accomplish a whole or a part of the functionalities. In addition, the specific names of the various functional circuits, functional units and functional modules are only used for distinguishing the various functional circuits, the functional units or the functional modules from each other conveniently, rather than limiting the protection scope of the present application.

What is claimed is:

1. A key reuse circuit, comprising:
    a key component configured to be communicated with a power voltage to generate a DC voltage and a startup-trigger-signal according to a user input; wherein the key component is one key in a key matrix;
    a switch circuit, connected with the key component and configured to generate a key trigger signal according to the DC voltage;
    a control circuit, connected with the switch circuit and the key component, and configured to reverse a level of an enable-regulation-signal according to the key trigger signal when a time duration of the key trigger signal is longer than or equal to a preset time duration, and to obtain a key value of the key component according to the key trigger signal and implement functions of the key component corresponding to the key value of the key component when the time duration of the key trigger signal is shorter than the preset time duration;
    a power on/off regulation circuit, connected with the switch circuit and the control circuit, and configured to generate a voltage-conversion-enable-signal according to the startup-trigger-signal and the enable-regulation-signal having a first level, and stop generating the voltage-conversion-enable-signal when a generation of the enable-regulation-signal having a second level is terminated;
    a buck circuit, connected with the power on/off regulation circuit, and configured to generate a first voltage according to the power voltage and the voltage-conversion-enable-signal, and stop generating the first voltage when a generation of the voltage-conversion-enable-signal is terminated;
    a DC/DC converter circuit, connected with the buck circuit, the switch circuit and the power on/off regulation circuit, and configured to convert the first voltage into an operating voltage to supply power for a plurality of functional circuits of the key reuse circuit, and stop generating the operating voltage when a generation of the first voltage is terminated.

2. The key reuse circuit according to claim 1, further comprising:
    a power adapter circuit connected with the buck circuit and configured to generate the power voltage according to a power input from an external power source.

3. The key reuse circuit according to claim 1, wherein the switch circuit comprises a first resistance, a second resistance, a third resistance, a fourth resistance, a first capacitance, and a first triode;
    wherein a first end of the first resistance and a first end of the first capacitance are collectively constituted as a DC voltage input of the switch circuit, a second end of the first resistance is connected with a first end of the third resistance and a first end of the second resistance, a second end of the third resistance is connected with a base electrode of the first triode, a second end of the second resistance and a second end of the first capacitance are connected with a power ground, and a collector electrode of the first triode is connected with a first end of the fourth resistance;
    a second end of the fourth resistance is a first operating voltage input of the switch circuit;

the collector electrode and the emitting electrode of the first triode are constituted as a key trigger signal output of the switch circuit.

4. The key reuse circuit according to claim 1, wherein the power on/off regulation circuit comprises: a fifth resistance, a sixth resistance, a seventh resistance, an eighth resistance, a second capacitance, a third capacitance, a first diode, and a second diode;

wherein a first end of the fifth resistance is a first operating voltage input of the power on/off regulation circuit, a second end of the fifth resistance is connected with a first end of the sixth resistance, a second end of the sixth resistance and a first end of the second capacitance are connected with an anode of the second diode, a cathode of the second diode is connected with a first end of the seventh resistance, a second end of the second capacitance is connected with a power ground, a second end of the seventh resistance is connected with a cathode of the first diode, an anode of the first diode is connected with a first end of the third capacitance and a first end of the eighth resistance, and a second end of the third capacitance is connected with the power ground;

a second end of the fifth resistance and a first end of the sixth resistance are constituted as an enable-regulation-signal input of the power on/off regulation circuit;

a second end of the seventh resistance and a cathode of the first diode are constituted as a voltage-conversion-enable-signal output of the power on/off regulation circuit;

a second end of the eighth resistance is a startup-trigger-signal input of the power on/off regulation circuit.

5. The key reuse circuit according to claim 1, wherein the buck circuit comprises a buck circuit chip, a fourth capacitance, a fifth capacitance, a sixth capacitance, a ninth resistance, a tenth resistance, an eleventh resistance, a twelfth resistance, a thirteenth resistance, a third diode, and a first inductance;

wherein a first end of the tenth resistance is a power voltage input of the buck circuit, a second end of the tenth resistance and a first end of the fourth capacitance are connected with an input of the buck circuit chip, a second end of the fourth capacitance and a ground terminal of the buck circuit chip are connected with a power ground, a self-boosting end of the buck circuit chip is connected with a first end of the fifth capacitance, a sensing end of the buck circuit chip and a second end of the fifth capacitance are connected with a first end of the first inductance, a second end of the first inductance and a first end of the eleventh resistance are connected with a first end of the twelfth resistance and the first end of the sixth capacitance, a second end of the eleventh resistance, a second end of the twelfth resistance, a second end of the sixth capacitance, and a feedback end of the buck circuit chip are connected with a first end of the thirteenth resistance, a second end of the thirteenth resistance is connected with the power ground, an enable pin of the buck circuit chip and a first end of the ninth resistance are connected with a cathode of the third diode, and a second end of the ninth resistance and an anode of the third diode are connected with the power ground;

the enable pin of the buck circuit chip is the voltage-conversion-enable-signal input of the buck circuit;

the second end of the first inductance is a first voltage output of the buck circuit.

6. The key reuse circuit according to claim 1, wherein the control circuit comprises a microprocessor and a seventh capacitance;

wherein a power terminal of the microprocessor is connected with a first end of the seventh capacitance, a second end of the seventh capacitance is connected with a power ground, and a ground terminal of the microprocessor is connected with the power terminal;

a first data input/output of the microprocessor and a second data input/output of the microprocessor are constituted as a key trigger signal input of the control circuit;

a third data input/output of the microprocessor is the enable-regulation-signal output of the control circuit;

the power terminal of the microprocessor is a first operating voltage input of the control circuit.

7. A POS terminal, comprising a key reuse circuit, wherein the key reuse circuit comprises:

a key component configured to be communicated with a power voltage to generate a DC voltage and a startup-trigger-signal according to a user input; wherein the key component is one key in a key matrix;

a switch circuit, connected with the key component and configured to generate a key trigger signal according to the DC voltage;

a control circuit, connected with the switch circuit and the key component, and configured to reverse a level of an enable-regulation-signal according to the key trigger signal when a time duration of the key trigger signal is longer than or equal to a preset time duration, and to obtain a key value of the key component according to the key trigger signal and implement functions of the key component corresponding to the key value of the key component when the time duration of the key trigger signal is shorter than the preset time duration;

a power on/off regulation circuit, connected with the switch circuit and the control circuit, and configured to generate a voltage-conversion-enable-signal according to the startup-trigger-signal and the enable-regulation-signal having a first level, and stop generating the voltage-conversion-enable-signal when a generation of the enable-regulation-signal having a second level is terminated;

a buck circuit, connected with the power on/off regulation circuit, and configured to generate a first voltage according to the power voltage and the voltage-conversion-enable-signal, and stop generating the first voltage when a generation of the voltage-conversion-enable-signal is terminated;

a DC/DC converter circuit, connected with the buck circuit, the switch circuit and the power on/off regulation circuit, and configured to convert the first voltage into an operating voltage to supply power for a plurality of functional circuits of the key reuse circuit, and stop generating the operating voltage when a generation of the first voltage is terminated.

8. The POS terminal according to claim 7, wherein the key reuse circuit further comprises:

a power adapter circuit connected with the buck circuit and configured to generate the power voltage according to an input from an external power source.

9. The POS terminal according to claim 7, wherein the switch circuit comprises a first resistance, a second resistance, a third resistance, a fourth resistance, a first capacitance, and a first triode;

wherein a first end of the first resistance and a first end of the first capacitance are collectively constituted as a DC voltage input of the switch circuit, a second end of the first resistance is connected with a first end of the third resistance and a first end of the second resistance, a second end of the third resistance is connected with a base electrode of the first triode, a second end of the second resistance and a second end of the first capacitance are connected with a power ground, and a collector electrode of the first triode is connected with a first end of the fourth resistance;

a second end of the fourth resistance is a first operating voltage input of the switch circuit;

the collector electrode and the emitting electrode of the first triode are constituted as a key trigger signal output of the switch circuit.

10. The POS terminal according to claim 7, wherein the power on/off regulation circuit comprises: a fifth resistance, a sixth resistance, a seventh resistance, an eighth resistance, a second capacitance, a third capacitance, a first diode, and a second diode;

wherein a first end of the fifth resistance is a first operating voltage input of the power on/off regulation circuit, a second end of the fifth resistance is connected with a first end of the sixth resistance, a second end of the sixth resistance and a first end of the second capacitance are connected with an anode of the second diode, a cathode of the second diode is connected with a first end of the seventh resistance, a second end of the second capacitance is connected with a power ground, a second end of the seventh resistance is connected with a cathode of the first diode, an anode of the first diode is connected with a first end of the third capacitance and a first end of the eighth resistance, and a second end of the third capacitance is connected with the power ground;

a second end of the fifth resistance and a first end of the sixth resistance are constituted as an enable-regulation-signal input of the power on/off regulation circuit;

a second end of the seventh resistance and a cathode of the first diode are constituted as a voltage-conversion-enable-signal output of the power on/off regulation circuit;

a second end of the eighth resistance is a startup-trigger-signal input of the power on/off regulation circuit.

11. The POS terminal according to claim 7, wherein the buck circuit comprises a buck circuit chip, a fourth capacitance, a fifth capacitance, a sixth capacitance, a ninth resistance, a tenth resistance, an eleventh resistance, a twelfth resistance, a thirteenth resistance, a third diode, and a first inductance;

wherein a first end of the tenth resistance is a power voltage input of the buck circuit, a second end of the tenth resistance and a first end of the fourth capacitance are connected with an input of the buck circuit chip, a second end of the fourth capacitance and a ground terminal of the buck circuit chip are connected with a power ground, a self-boosting end of the buck circuit chip is connected with a first end of the fifth capacitance, a sensing end of the buck circuit chip and a second end of the fifth capacitance are connected with a first end of the first inductance, a second end of the first inductance and a first end of the eleventh resistance are connected with a first end of the twelfth resistance and the first end of the sixth capacitance, a second end of the eleventh resistance, a second end of the twelfth resistance, a second end of the sixth capacitance, and a feedback end of the buck circuit chip are connected with a first end of the thirteenth resistance, a second end of the thirteenth resistance is connected with the power ground, an enable pin of the buck circuit chip and a first end of the ninth resistance are connected with a cathode of the third diode, and a second end of the ninth resistance and an anode of the third diode are connected with the power ground;

the enable pin of the buck circuit chip is the voltage-conversion-enable-signal input of the buck circuit;

the second end of the first inductance is a first voltage output of the buck circuit.

12. The POS terminal according to claim 7, wherein the control circuit comprises a microprocessor and a seventh capacitance;

wherein a power terminal of the microprocessor is connected with a first end of the seventh capacitance, a second end of the seventh capacitance is connected with a power ground, and a ground terminal of the microprocessor is connected with the power terminal;

a first data input/output of the microprocessor and a second data input/output of the microprocessor are constituted as a key trigger signal input of the control circuit;

a third data input/output of the microprocessor is the enable-regulation-signal output of the control circuit;

the power terminal of the microprocessor is a first operating voltage input of the control circuit.

\* \* \* \* \*